United States Patent
Adam et al.

(10) Patent No.: US 9,385,231 B2
(45) Date of Patent: Jul. 5, 2016

(54) DEVICE STRUCTURE WITH INCREASED CONTACT AREA AND REDUCED GATE CAPACITANCE

(71) Applicant: GLOBALFOUNDRIES INC., Grand Cayman (KY)

(72) Inventors: Thomas N. Adam, Slingerlands, NY (US); Kangguo Cheng, Schenectady, NY (US); Ali Khakifirooz, Mountain View, CA (US); Alexander Reznicek, Troy, NY (US)

(73) Assignee: GLOBALFOUNDRIES INC., Grand Cayman (KY)

( * ) Notice: Subject to any disclaimer, the term of this patent is extended or adjusted under 35 U.S.C. 154(b) by 0 days.

(21) Appl. No.: 14/530,796

(22) Filed: Nov. 2, 2014

(65) Prior Publication Data

US 2015/0060944 A1 Mar. 5, 2015

Related U.S. Application Data

(62) Division of application No. 13/717,235, filed on Dec. 17, 2012, now Pat. No. 8,877,604.

(51) Int. Cl.

| | |
|---|---|
| *H01L 29/78* | (2006.01) |
| *H01L 29/66* | (2006.01) |
| *H01L 29/49* | (2006.01) |
| *H01L 29/04* | (2006.01) |
| *H01L 29/08* | (2006.01) |
| *H01L 29/165* | (2006.01) |
| *H01L 29/786* | (2006.01) |

(52) U.S. Cl.
CPC .......... *H01L 29/7848* (2013.01); *H01L 29/045* (2013.01); *H01L 29/0847* (2013.01); *H01L 29/165* (2013.01); *H01L 29/4983* (2013.01); *H01L 29/66545* (2013.01); *H01L 29/66772* (2013.01); *H01L 29/7841* (2013.01); *H01L 29/78618* (2013.01); *H01L 29/78654* (2013.01)

(58) Field of Classification Search
CPC .............. H01L 29/7848; H01L 29/66772; H01L 29/78654; H01L 29/78618; H01L 29/7841; H01L 29/0847; H01L 29/165; H01L 29/4983; H01L 29/045; H01L 29/66545
See application file for complete search history.

(56) References Cited

U.S. PATENT DOCUMENTS

| | | | |
|---|---|---|---|
| 6,690,072 B2 | 2/2004 | Cabral, Jr. et al. | |
| 6,939,751 B2 | 9/2005 | Zhu et al. | |
| 7,060,546 B2 | 6/2006 | Hsu et al. | |
| 7,332,400 B2 | 2/2008 | Jin et al. | |
| 2004/0063286 A1* | 4/2004 | Kim | ............... H01L 21/823412 438/283 |
| 2005/0145956 A1* | 7/2005 | Wang | ............... H01L 21/26586 257/410 |
| 2006/0286729 A1* | 12/2006 | Kavalieros | ........ H01L 21/28079 438/183 |

(Continued)

*Primary Examiner* — Michelle Mandala
(74) *Attorney, Agent, or Firm* — Yuanmin Cai; Andrew M. Calderon; Roberts Mlotkowski Safran & Cole P.C.

(57) ABSTRACT

A FET structure including epitaxial source and drain regions includes large contact areas and exhibits both low resistivity and low parasitic gate to source/drain capacitance. The source and drain regions are laterally etched to provide recesses for accommodating low-k dielectric material without compromising the contact area between the source/drain regions and their associated contacts. A high-k dielectric layer is provided between the raised source/drain regions and a gate conductor as well as between the gate conductor and a substrate, such as an ETSOI or PDSOI substrate. The structure is usable in electronic devices such as MOSFET devices.

25 Claims, 5 Drawing Sheets

(56) References Cited

U.S. PATENT DOCUMENTS

| | | | |
|---|---|---|---|
| 2009/0283756 A1* | 11/2009 | Hellings | H01L 29/0843 257/24 |
| 2011/0165739 A1 | 7/2011 | Majumdar et al. | |
| 2011/0254090 A1 | 10/2011 | Cheng et al. | |
| 2011/0291202 A1 | 12/2011 | Cheng et al. | |
| 2012/0061759 A1 | 3/2012 | Cheng et al. | |
| 2012/0161238 A1* | 6/2012 | Scheiper | H01L 21/823412 257/368 |
| 2013/0285138 A1 | 10/2013 | Vega et al. | |

* cited by examiner

DEVICE STRUCTURE WITH INCREASED CONTACT AREA AND REDUCED GATE CAPACITANCE

CROSS REFERENCE TO RELATED APPLICATIONS

This application is a divisional of U.S. patent application Ser. No. 13/717,235, the complete disclosure of which is expressly incorporated by reference herein in its entirety for all purposes.

FIELD

The present disclosure relates generally to semiconductor devices, and more specifically, to field-effect transistors (FETs) formed on semiconductor-on-insulator (SOI) substrates having epitaxial source and drain regions.

BACKGROUND

With shrinking dimensions of various integrated circuit components, transistors such as FETs have experienced dramatic improvements in both performance and power consumption. These improvements may be largely attributed to the reduction in dimensions of components used therein, which in general translate into reduced capacitance, resistance, and increased through-put current from the transistors. Nevertheless, performance improvement brought up by this type of "classic" scaling, in device dimensions, may cause increases in both external resistance and parasitic capacitance. Planar transistors, such as metal oxide semiconductor field effect transistors (MOSFETs) are particularly well suited for use in high-density integrated circuits. As the size of MOSFETs and other devices decreases, the dimensions of source/drain regions, channel regions, and gate electrodes of the devices, also decrease.

The design of ever-smaller planar transistors with short channel lengths makes it necessary to provide very shallow source/drain junctions. Shallow junctions are necessary to avoid lateral diffusion of implanted dopants into the channel, since such diffusion disadvantageously contributes to leakage currents and poor breakdown performance. Shallow source/drain junctions, with a thickness of about 30 nm to 100 nm, are generally required for acceptable performance in short channel devices. Semiconductor-on-insulator (SOI) technology allows the formation of high-speed, shallow junction devices. In addition, SOI devices improve performance by reducing parasitic junction capacitance.

In a SOI substrate, a buried oxide (BOX) film comprising silicon dioxide may be formed on a silicon substrate and a single crystal silicon thin film is formed thereon. Various methods of fabricating such SOI substrates are known, one of which is Separation-by-Implanted Oxygen (SIMOX), wherein oxygen is ion implanted into a single crystal silicon substrate to form a BOX film. Another method of forming an SOI substrate is wafer bonding, wherein two semiconductor substrates with silicon oxide surface layers are bonded together at the silicon oxide surfaces to form a BOX layer between the two semiconductor substrates.

The thickness of the silicon layer of an extremely thin silicon on insulator (ETSOI) layer typically ranges from 3 nm to 10 nm. ETSOI technology provides an extremely thin silicon channel wherein the majority carriers are fully depleted during operation.

Scaling of fully depleted CMOS technology, particularly thin SOI devices, requires raised source/drain (S/D) to lower the external resistance. Conventional raised S/D comes with the drawback of increased parasitic capacitance between the raised S/D and the gate. Furthermore, in some device structures, for example, extremely thin SOI (ETSOI), the extension resistance becomes the dominant component of total external resistance. The extension resistance can be lowered by thickening the SOI in extension regions. However, a trade-off is made between two competing requirements—lowering external resistance and minimizing the increase of parasitic capacitance.

The shrinking of device dimensions to 25 nm node and beyond, e.g. 22 nm node, causes an increase in both external resistance and parasitic capacitance. Raised source/drain (RSD) fabrication by epitaxy has been adopted to reduce S/D resistance. Two types of raised RSD devices include vertical RSD and faceted RSD. At a given gate pitch, vertical RSD has enabled the use of a thin spacer and thus increased silicide-to-SD contact area. It therefore advantageously lowers contact resistance. A drawback of this configuration is high parasitic gate-to-SD capacitance.

Faceted RSD devices offer the advantage of reduced gate-to-SD parasitic capacitance, but require a silicide spacer that prevents fully siliciding the thin SOI layer. The relatively thick spacer reduces silicide-to-SD contact area and thus adversely increases contact resistance.

Figure 9:
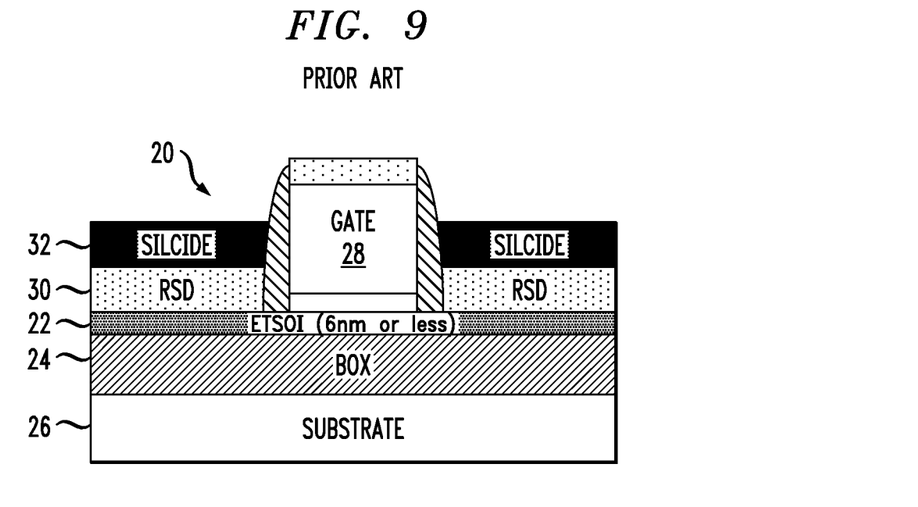
FIG. 9 is a schematic illustration showing a prior art device including vertical RSD regions.

FIG. 9 shows an example of a vertical RSD structure 20. The structure includes a semiconductor on insulator (SOI) substrate including a first semiconductor layer 22, an insulator layer 24, and a second semiconductor layer 26. The first semiconductor layer 22 is an ETSOI layer having a thickness of less than 10 nm, e.g. 6 nm. In this example, the insulator layer 24 is a buried oxide (BOX) layer. A high-k/metal gate structure 28 is formed on the ETSOI layer. RSD regions 30 adjoin the ETSOI channel region. Silicide contact layers 32 are formed on the RSD regions.

Figure 10:
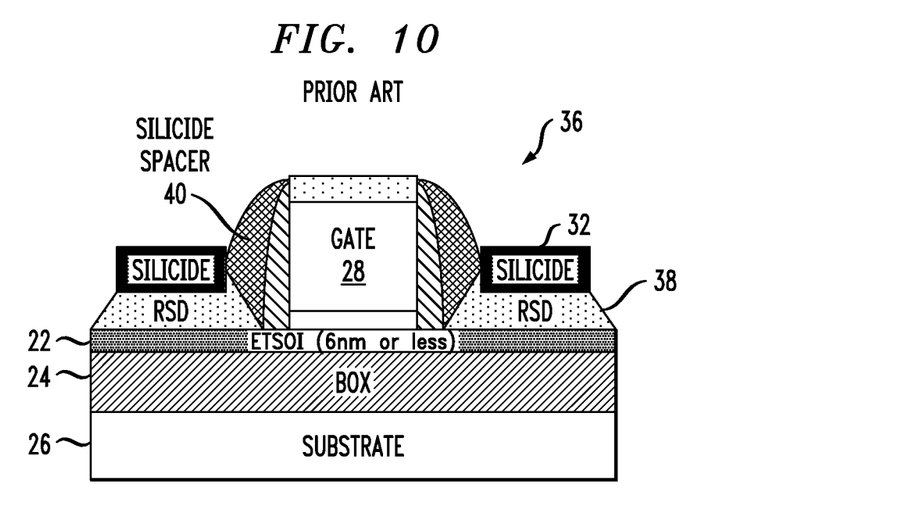
FIG. 10 is a schematic illustration showing a prior art device including faceted RSD regions.

FIG. 10 shows a faceted RSD structure 36 having some of the same elements found in the vertical RSD structure 20. In situ boron doped (ISBD) and in situ phosphorus doped (ISPD) faceted epitaxy may, for example, be used to form the RSD regions 38. A second silicide spacer 40 comprising, for example, silicon nitride, is required in this structure 36. High resistivity of the structure 36 is due to reduced silicide-to-SD contact area. A nitride cap may be provided on the gate electrode.

SUMMARY

Principles of the present disclosure provide techniques for providing RSD structures having low contact resistance and further exhibiting low parasitic capacitance. Such principles further provide other FET structures with improved functionality.

In accordance with a first exemplary embodiment, a method is provided that includes obtaining a semiconductor-on-insulator substrate, forming a sacrificial gate layer on the substrate, and forming doped raised source and drain regions on the substrate, each raised source and drain region having a top surface and a bottom surface. The sacrificial gate layer is removed, thereby forming a space between the raised source and drain regions. The method further includes laterally etching the raised source and drain regions to form laterally expanded recesses extending from the space into the raised source and drain regions and filling the space with a first dielectric material.

In accordance with a further embodiment, an exemplary method includes obtaining a structure including a semiconductor-on-insulator substrate, a dielectric layer, raised source and drain regions between the substrate and the dielectric layer, each raised source and drain region having a laterally extending recess bounded by surfaces extending diagonally with respect to the substrate and the dielectric layer, a trench above the substrate and between the raised source and drain regions, and a first dielectric material within the trench and laterally extending recesses. The first dielectric material is removed from the trench such that the first dielectric material remains in the laterally extending recesses. A dielectric spacer is formed on the structure within the trench, the dielectric spacer comprising material having a higher k value than the k value of the first dielectric material. A gate conductor is formed within the trench and adjoins the dielectric spacer.

A further exemplary method includes obtaining a structure including a semiconductor-on-insulator substrate, a dielectric layer, raised source and drain regions between the substrate and the dielectric layer and having top and bottom surfaces, and a trench above the substrate and between the raised source and drain regions, laterally etching the raised source and drain regions along crystal planes thereof to form laterally expanded recesses extending from the trench into the raised source and drain, and filling the trench and laterally extending recesses with a first dielectric material.

A first exemplary structure includes a substrate having a semiconductor layer on an insulating layer such as a BOX layer. Epitaxial raised source and drain regions are on the semiconductor layer of the substrate, each including top and bottom surfaces and a laterally extending recess defined by diagonally (e.g. 54 degree angle for (111) planes of SiGe) extending surfaces between the top and bottom surfaces thereof. A gate conductor is located between the source and drain regions. A first dielectric spacer is contained within each laterally extending recess. A second dielectric spacer is positioned between the gate conductor and the substrate and between the gate conductor and the first dielectric spacers, the second dielectric spacer being comprised of a material having a dielectric constant higher than the first dielectric spacer.

A second structure in accordance with a further exemplary embodiment includes a substrate including a semiconductor layer on an insulating layer. Epitaxial raised source and drain regions are located on the semiconductor layer of the substrate, each of the raised source and drain regions including top and bottom surfaces and a laterally extending recess defined by converging crystal planes between the top and bottom surfaces. The structure further includes a trench above the substrate and between the laterally extending recesses within the raised source and drain regions and a dielectric layer on the top surface of each of the raised source and drain regions.

As used herein, "facilitating" an action includes performing the action, making the action easier, helping to carry the action out, or causing the action to be performed. Thus, by way of example and not limitation, instructions executing on one processor might facilitate an action carried out by instructions executing on a remote processor, by sending appropriate data or commands to cause or aid the action to be performed. For the avoidance of doubt, where an actor facilitates an action by other than performing the action, the action is nevertheless performed by some entity or combination of entities.

One or more embodiments of the invention or elements thereof can be implemented in the form of a computer program product including a tangible computer readable recordable storage medium with computer usable program code for performing the method steps indicated. Furthermore, one or more embodiments of the invention or elements thereof can be implemented in the form of a system (or apparatus) including a memory, and at least one processor that is coupled to the memory and operative to perform exemplary method steps. Yet further, in another aspect, one or more embodiments of the invention or elements thereof can be implemented in the form of means for carrying out one or more of the method steps described herein; the means can include (i) hardware module(s), (ii) software module(s), or (iii) a combination of hardware and software modules; any of (i)-(iii) implement the specific techniques set forth herein, and the software modules are stored in a tangible computer-readable recordable storage medium (or multiple such media).

Substantial beneficial technical effects are provided. For example, one or more embodiments may provide one or more of the following advantages:

Low contact resistance;
Low gate to source/drain parasitic capacitance;
Low source/drain resistance;
Improved gate length scaling.

These and other features and advantages of the present invention will become apparent from the following detailed description of illustrative embodiments thereof, which is to be read in connection with the accompanying drawings.

BRIEF DESCRIPTION OF THE DRAWINGS

The following detailed description, given by way of example, will best be appreciated in conjunction with the accompanying drawings, wherein like reference numerals denote like elements and parts, in which.

DETAILED DESCRIPTION

Figure 1:
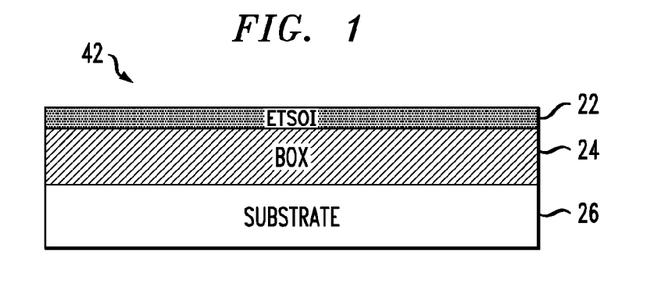
FIG. 1 is a side cross-sectional view of an extremely thin semiconductor-on-insulator (ETSOI) wafer.

FIG. 1 illustrates an ETSOI wafer 42 including a first silicon layer 22 (hereinafter referred to as an ETSOI layer) overlying an insulating layer 24 such as a buried oxide (BOX) layer. The ETSOI layer 22 has a thickness preferably less than 10 nm. A semiconductor substrate layer 26 underlies the insulating layer 24. In one or more embodiments, the BOX layer has a thickness of about 145 nm while the substrate layer 26 is about 875 μm.

The ETSOI layer 22 is preferably made of a semiconducting material such as crystalline silicon, silicon germanium, or carbon doped silicon. In the case of Si:C, carbon constitutes 0.2-4% carbon, preferably 0.5-2.7% carbon by atomic weight percentage. The ETSOI layer 22 may be thinned to a desired thickness by planarization, grinding, wet etch, dry etch, oxidation followed by oxide etch, or any combination thereof, as known to those of skill in the art. One method of thinning the ETSOI layer 22 consists of oxidizing silicon by a thermal dry or wet oxidation process, and then wet etching the oxide layer using preferably a hydrofluoric (HF) acid mixture. This process can be repeated to achieve the desired thickness. The ETSOI layer 22 on the wafer 42 is preferably less than 10 nm in thickness, and is 6 nm thick in an exemplary embodiment. The second semiconductor layer 26 is made of a semiconducting material including, but not limited to Si, strained Si, Si:C, SiGe, SiGe:C, Si alloys, Ge, Ge alloys, GaAs, InAs, InP as well as other III/V and II/VI compound semiconductors.

The insulating layer 24 spans the ETSOI layer 22, extending on top of the substrate semiconductor layer 26, and can be formed by implanting a high-energy dopant into the substrate 26 and then annealing the structure to form a buried insulating layer. Alternatively, the insulating layer 24 may be deposited or grown epitaxially prior to the formation of ETSOI layer 22. Another and more common method of forming an SOI substrate is wafer bonding, wherein two semiconductor substrates with silicon oxide surface layers are bonded together at the silicon oxide surfaces to form a BOX layer between the two semiconductor substrates. Silicon dioxide is among the oxide materials that may form the buried insulating layer.

Figure 2:
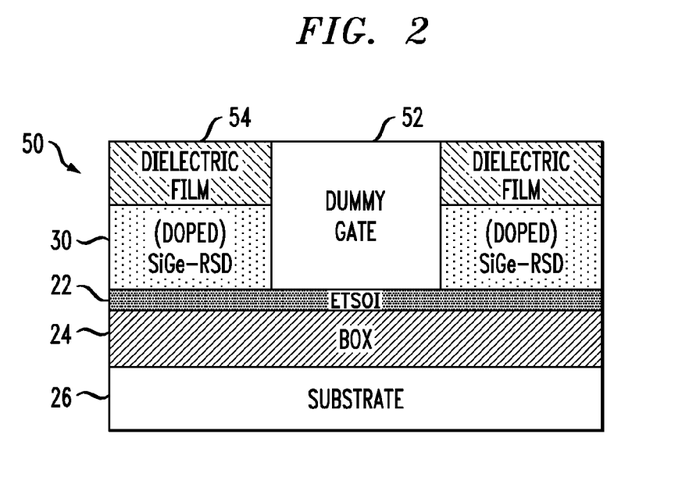
FIG. 2 is schematic illustration showing the ETSOI wafer following growth of a sacrificial gate, RSD regions, and dielectric fill layers.

FIG. 2 shows a structure 50 including a sacrificial "dummy" gate 52 formed on a portion of the wafer 42. The sacrificial gate is a structure that defines the geometry of the later formed gate structure that operates the semiconductor device, in which the dummy gate is removed and the gate structure that operates the semiconductor device is formed in its place, as described further below. In one exemplary embodiment, the sacrificial gate 52 can be comprised of a sacrificial gate oxide on ETSOI layer, a polysilicon layer on top of the sacrificial oxide, and a nitride cap on top of the polysilicon layer. In another embodiment, the sacrificial gate 52 can be comprised of a silicon nitride layer. The disclosed sacrificial gate materials are considered exemplary as opposed to limiting. Other suitable material or combinations of materials familiar to those of skill in the art may alternatively be employed. A layer of sacrificial gate material is grown first on the ETSOI layer 22 in the illustrative embodiment followed by application of a mask (not shown) to the region of the gate material layer that is to comprise the sacrificial gate 52. The gate material that is not covered by the gate patterning mask is removed by etching or other suitable procedure. RSD regions 30 are grown epitaxially employing processing techniques familiar to those of skill in the art on the exposed areas of the wafer that are not covered by a gate structure and its optional spacers. Boron doped SiGe may be employed to form pFET structures while nFET structures can be formed using phosphorous or arsenic doped SiGe RSD regions in some exemplary embodiments. In one exemplary embodiment, both RSD regions 30 are comprised of SiGe. In another exemplary embodiment, the RSD regions are comprised of Si:C comprising up to 4% carbon and doped with a group V element to form a nFET device. Growth of the RSD regions 30 on the ETSOI layer 22 is followed by forming the dielectric film layer 54. In one exemplary embodiment, the dielectric film layer 54 is comprised of a low-k material such as silicon oxide, carbon doped silicon oxide, or fluorine doped silicon oxide. Alternatively, the dielectric layer 54 may comprise multiple layers. A process for forming a dummy gate and adjoining layers of an RSD device is disclosed in U.S. Pat. No. 6,939,751, which is incorporated by reference herein.

Referring again to the RSD regions, an in-situ doped semiconductor material may be provided by selective-epitaxial growth of SiGe atop the ETSOI layer 22. The Ge content of the epitaxial SiGe may range from 5% to 60%, by atomic weight %. The epitaxial SiGe may be under an intrinsic compressive strain, in which the compressive strain is produced by a lattice mismatch between the larger lattice dimension of the SiGe and the smaller lattice dimension of the layer on which the SiGe is epitaxially grown. The epitaxial grown SiGe produces a compressive strain in the portion of the ETSOI layer 22 in which the channel of a semiconductor device, such as a pFET device, is subsequently formed. The term "in-situ doped" means that the dopant that provides the conductivity of the raised source regions and raised drain regions is introduced during the epitaxial growth process that provides the semiconductor material of the raised source regions and the raised drain regions. The in-situ doped semiconductor material can be doped with a first conductivity type dopant during the epitaxial growth process. As used herein, the term "conductivity type" denotes a dopant region being p-type or n-type. As used herein, "p-type" refers to the addition of impurities to an intrinsic semiconductor that creates deficiencies of valence electrons. In a silicon-containing substrate, examples of p-type dopants, i.e., impurities include but are not limited to: boron, aluminium, gallium and indium. As used herein, "n-type" refers to the addition of impurities that contributes free electrons to an intrinsic semiconductor. In a silicon containing substrate examples of n-type dopants, i.e., impurities, include but are not limited to antimony, arsenic and phosphorous. Ion implantation may be employed instead of in situ doping. U.S. Publication No. 2012/0061759 discloses suitable RSD materials and doping levels for some exemplary embodiments, and is incorporated by reference herein.

Figure 3:
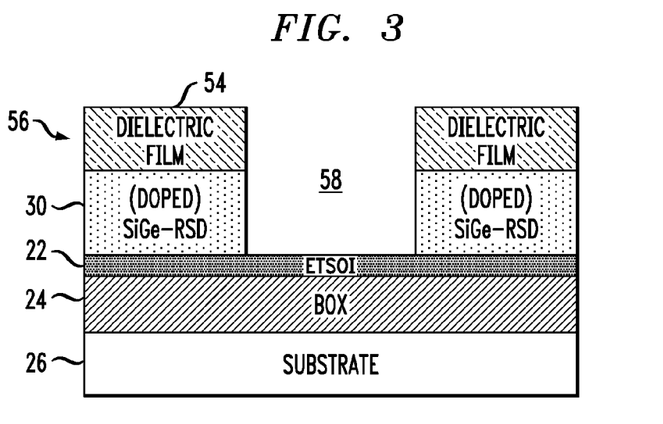
FIG. 3 is a schematic illustration showing removal of the sacrificial gate from the structure of FIG. 2.

The structure 50 shown in FIG. 2 is processed as shown in FIG. 3 to remove the sacrificial gate 52, preferably by an etching process such as dry (ion) etching. Removal of the sacrificial gate 52 results in a structure 56 having a trench 58 between the RSD regions that extends to the ETSOI layer 22. The dimensions of the trench correspond to those of the gate electrode and other layer(s) that may subsequently be formed therein. Gate electrode thicknesses range in some embodiments from 20-100 nm and gate lengths may range from 10-250 nm, although lesser and greater thicknesses and lengths may be employed if desired. The dielectric film layer 54 comprises two discrete portions separated by the sacrificial gate, each adjoining the top surface of one of the RSD regions 30.

Figure 4:
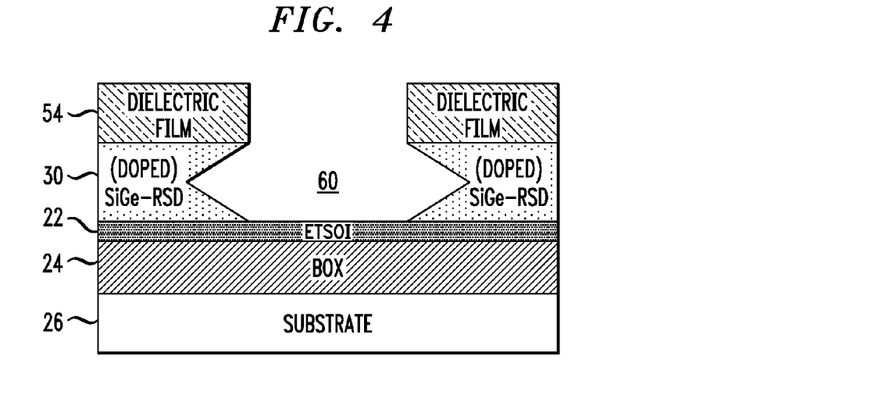
FIG. 4 is a schematic illustration showing lateral etching of the RSD regions.

The structure 56 shown in FIG. 3 is subjected to a faceted etch process. In an exemplary embodiment, the trench 58 is subjected to hydrogen chloride gas in an epitaxial reactor. This results in lateral, anisotropic etching of the doped RSD regions 30 as shown schematically in FIG. 4. In another exemplary embodiment, a wet anisotropic etching process using tetramethylammonium hydroxide (TMAH) may be employed. Each RSD region has a sigma (Σ) or "reverse sigma" configuration when viewed in cross section following the etching process. The laterally extending recess within each epitaxial raised source and drain region is defined by surfaces that extend diagonally from the top and bottom surfaces thereof to an intersection within each epitaxial raised source and drain region. Accordingly, the RSD regions 30 continue to maintain large contact areas with the dielectric film layers 54 and the ETSOI layer 22 as the lateral etching removes more material from the middle portions of the RSD regions than the top and bottom portions. The crystal structure of the material comprising the RSD regions contributes to the effective formation of the laterally extending, triangular recesses. Etch rates of the materials comprising the RSD regions 30 are different in different crystal planes, resulting in anisotropic etching of these regions. In an exemplary structure where the RSD regions comprise epitaxially grown SiGe on a silicon-on-insulator substrate, the etch velocity slows substantially in the (111) planes, which planes function as etch stops that form at least part of the diagonally extending surfaces of the etched RSD regions. If etching is discontinued relatively early, the recesses in the RSD regions may resemble trapezoids rather than triangles as shown in FIG. 4. In the exemplary embodiment, the etching stops along (111)-planes, which have a 54 degree angle. Accordingly, in order to obtain a structure as shown in FIG. 4, the thickness of the RSD regions should be between certain limits and etching is continued for a sufficient time until the desired structure is completed. Either recess configuration (triangular or trapezoidal) can provide satisfactory results. A trench 60 including laterally extending recesses within the RSD regions 30 is thereby formed. Each recess is positioned between the top and bottom surfaces of one of the RSD regions. The dielectric film layers 54 are resistant to the hydrogen chloride gas used in the exemplary process and accordingly maintain substantially the same structure following etching. Etching in the epitaxial reactor using HCl may be conducted at about 600° C. at about 10 Torr for at least thirty seconds in one exemplary process. If chlorine is employed instead of HCl, etching may be conducted at about 500° C. at about 10 Torr.

Figure 5:
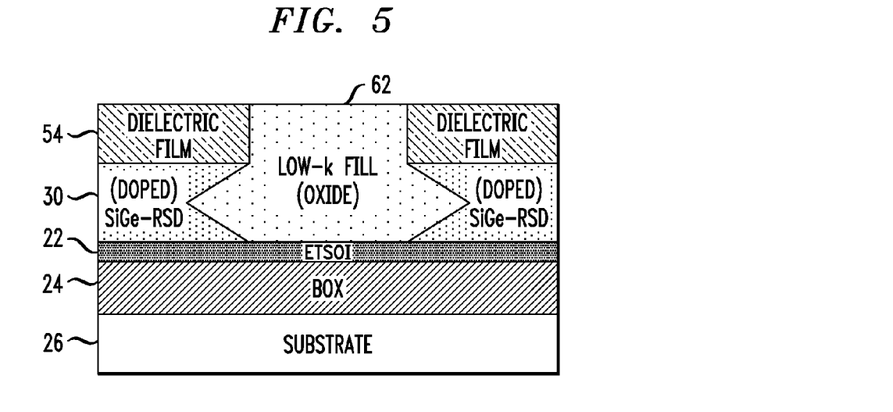
FIG. 5 is a schematic illustration showing the filling of a space created by removal of the sacrificial gate and the etching of the RSD regions with a low-k dielectric material.

Upon completion of the etching of the RSD regions, the trench 60 is filled with a low-k dielectric fill material 62 such as silicon dioxide, carbon doped silicon oxide, fluorine doped silicon oxide, boron nitride, boron carbon nitride, or other appropriate materials. The low-k dielectric can be deposited by chemical vapour deposition (CVD), spin-on, atom layer deposition (ALD) or any other suitable process technique. The k value of the low-k fill material is preferably less than the k value of silicon nitride. The k value of the low-k material ranges from 2 to 6 and preferably from 2.4 to 4, and more preferably from 2.5 to 3.5. FIG. 5 shows an exemplary structure following this step.

The structure of FIG. 5 is subjected to dry (ion) etching whereby the low-k dielectric fill material is removed from the space comprising the originally formed trench 58 shown in FIG. 3. The fill material remains in the laterally extending recesses of the trench 60 and comprises spacers 64 separating the RSD regions 30 from the newly formed trench 66 in the structure 68 shown in FIG. 6. The etching process is selective to the oxide material comprising the fill material 62.

Figure 6:
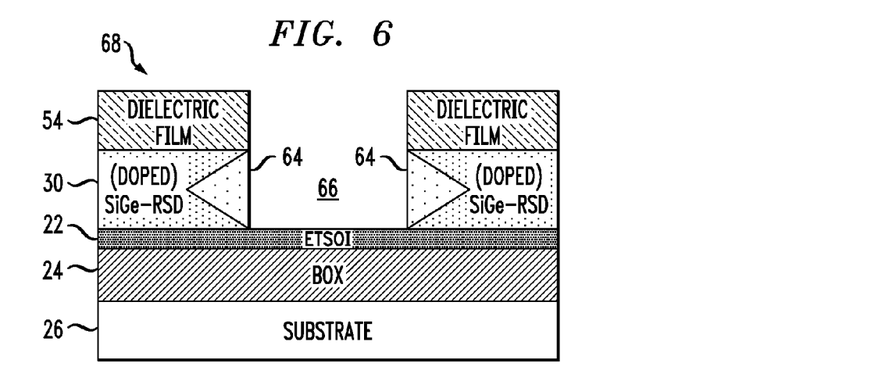
FIG. 6 is a schematic illustration showing the formation of a recess in the structure of FIG. 5 through partial removal of the low-k dielectric material.

A high-k material layer is formed on the structure 68 as a spacer/gate dielectric layer 70. High-k dielectric material having a dielectric constant (k value) greater than, for example, 3.9, which is the dielectric constant of silicon dioxide, may be employed. The high-k dielectric material may include a dielectric metal oxide. In some implementations, a high-k material that has a dielectric constant in the range of about 4.0-8.0 may be utilized. Exemplary high-k dielectric materials may include $HfO_2$, $ZrO_2$, $La_2O_3$, $Al_2O_3$, $TiO_2$, $SrTiO_3$, $LaAlO_3$, $Y_2O_3$, $HfO_xN_y$, $ZrO_xN_y$, $La_2O_xN_y$, $Al_2O_xN_y$, $TiO_xN_y$, $SrTiO_xN_y$, $LaAlO_xN_y$, or $Y_2O_xN_y$. In other implementations, a silicon nitride ($Si_3N_4$) dielectric material having a dielectric constant of about 7.5 may be used as the spacer and gate dielectric materials. The gate dielectric layer, i.e. the layer between the gate metal and the ETSOI layer, may also include a multi-layer of $SiO_2$, SiON, SiN, and a high-k dielectric material, including but not limited to hafnium oxide ($HfO_2$), aluminium oxide ($Al_2O_3$), lanthanum oxide ($La_2O_3$), zirconium oxide ($ZrO_2$), and their respective silicates. The thickness of the gate dielectric may be in the range of 1.0 nm-5.0 nm. The spacer/gate dielectric layer 70 may be formed by using a blanket layer deposition and an anisotropic etchback method. It is noted that the material for the spacer may be deposited using any deposition method, e.g., chemical vapor deposition. The spacer may comprise a single layer or multiple layers. The gate dielectric layer 70A may be formed of the same material as the remainder of the spacer/gate dielectric layer 70 or of a different material. In some embodiments, it is formed prior to deposition of the high-k material forming the remainder of the layer.

A gate electrode layer 72 is deposited on the structure by PVD, ALD, CVD or other suitable processes known to those of skill in the art. Excess gate material can be removed by etching or other subtractive process. The gate electrode may be comprised of metals such as TiN, TaN, W, WN, TaAlN, Al, Au, Ag, or a combination of such metals. Gate electrodes layers 72 may also include a poly-silicon layer located on top of a metal material, whereby the top of the poly-silicon layer may be silicided. Gate electrodes formed on the wafer may have a thickness approximately in the range of 20-100 nm and a length in the range of about 10-250 nm, although lesser and greater thicknesses and lengths may also be contemplated.

Figure 7A:
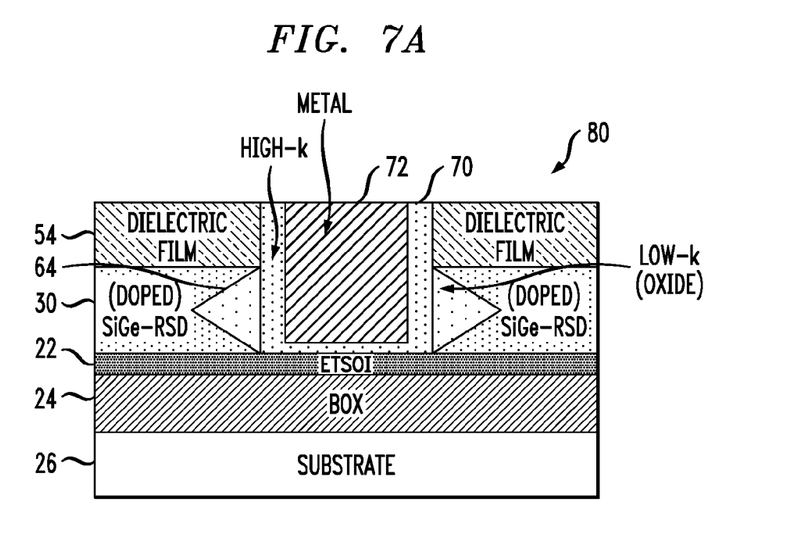
FIG. 7A is a schematic illustration showing the formation of a replacement metal gate in the recess shown in FIG. 6.

The resulting structure 80 is shown in FIG. 7A. The dielectric film layers 54 are later replaced by contact layers 32 such as metal silicide layers in accordance with salicide processing technology familiar to those of skill in the art to form the FET structure shown in FIG. 7B.

Figure 7B:
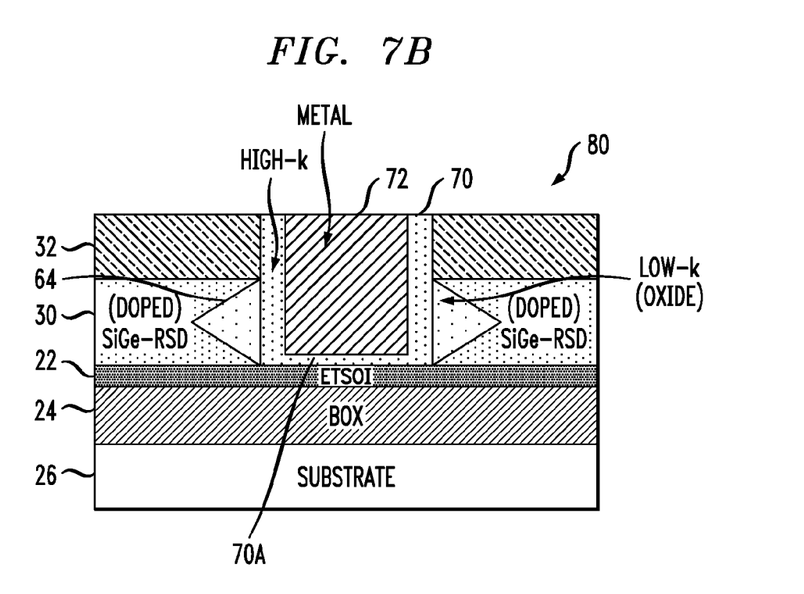
FIG. 7B is a schematic illustration of an FET structure formed from the structure shown in FIG. 7A.
Figure 8A:
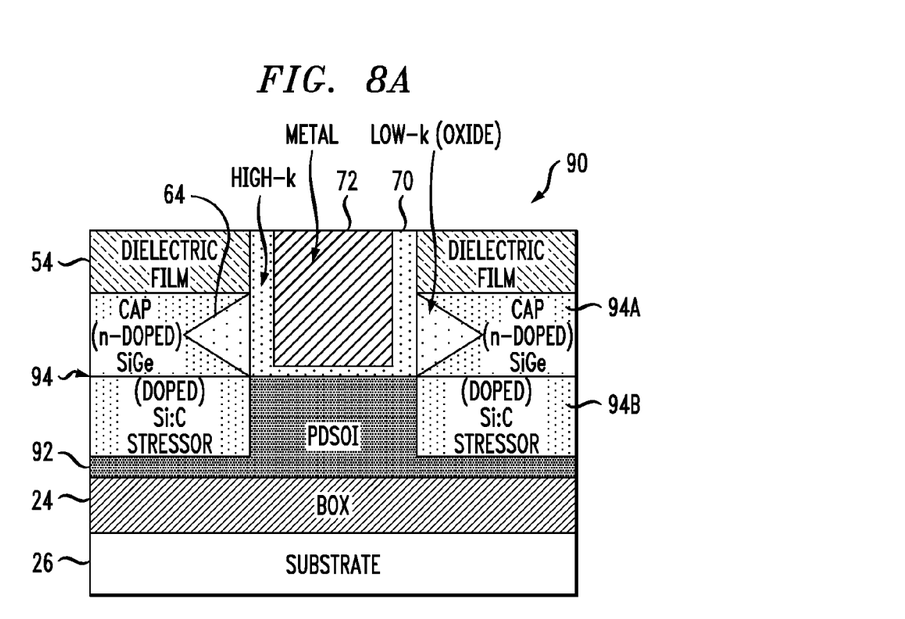
FIG. 8A is a schematic illustration of an alternative embodiment showing the formation of a replacement metal gate in a structure including a partially depleted silicon on insulator (PDSOI) substrate.

A process similar to that shown and described with respect to FIGS. 1-7 can be employed to form the structure 90 shown in FIG. 8A. This structure 90 includes a partially depleted silicon on insulator layer 92 rather than an ETSOI layer. In addition, the source/drain areas adjoining the gate are recessed and the doped, epitaxially formed regions 94 on the PDSOI layer 92 are not monolithic in structure. The dielectric film layers 54 are removed and replaced by contact layers 32 to form the FET structure shown in FIG. 8B. The use of substrates other than those including ETSOI and PDSOI layers is feasible for providing FET structures in accordance with the teachings herein. Each source/drain region 94 comprises a doped Si:C embedded stressor layer 94B which extends to the top surface of the PDSOI layer 92 to create tensile stress. Each RSD region further comprises an epitaxially formed n-doped SiGe capping layer 94A. The SiGe capping layer 94A is easily etched in hydrogen chloride and in chlorine to form the lateral recesses in which the low-k oxide spacers 64 are later formed. It has been found that SiGe is more easily etched in such environments than silicon. The recesses are formed along crystal planes between the top and bottom surfaces of the SiGe capping layer 94A in this exemplary embodiment of a nFET structure. Similar techniques can alternatively be employed to fabricate a pFET structure (not shown). For example, a p-doped SiGe capping layer may be formed over a Si:Ge embedded stressor layer in a pFET device. The spacers 64, 70 and gate conductor 72 are formed in the same manner described above with respect to the ETSOI structure 80. It will be appreciated that the techniques described above can be employed to form integrated circuits having more than one device. For example, by adding conventional patterning techniques, both n-type MOSFET and p-type MOSFET devices can be formed on the same chip.

Figure 8B:
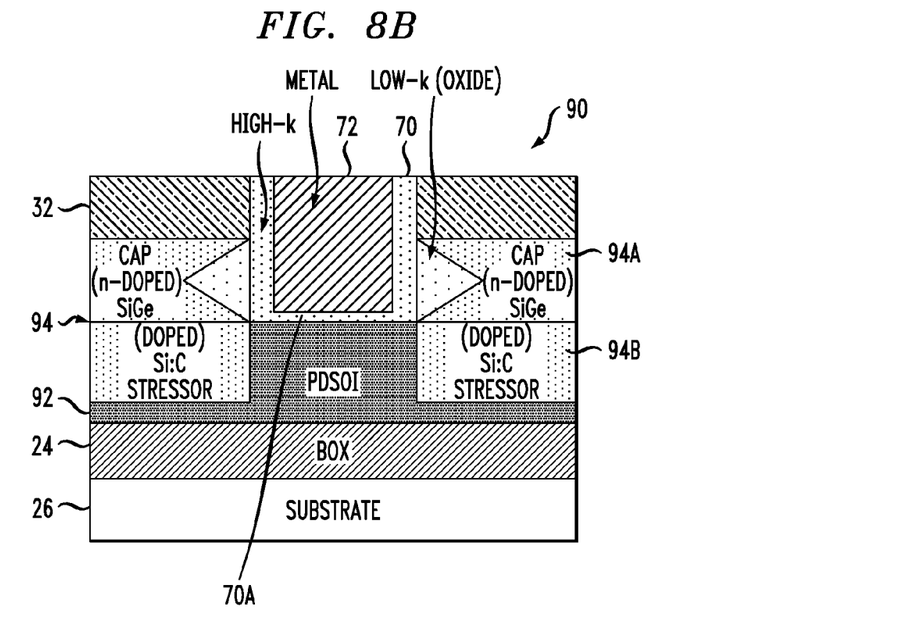
FIG. 8B is a schematic illustration of an FET structure formed from the structure shown in FIG. 8A.

Given the discussion thus far, a structure is provided that includes a substrate having a semiconductor layer on an insulating layer such as a BOX layer. Epitaxial source and drain regions 30, 94 are on the semiconductor layer of the substrate, each including a laterally extending recess defined by diagonally (e.g. 54 degree angle for (111) planes of SiGe) extending surfaces between the top and bottom surfaces thereof. A gate conductor 72 is located between the source and drain regions 30 or alternatively regions 94 as shown in FIGS. 8A-B. A first dielectric spacer 64 is contained within each laterally extending recess. A second dielectric spacer 70 is positioned between the gate conductor 72 and the substrate and between the gate conductor and the first dielectric spacers 64, the second dielectric spacer being comprised of a material having a dielectric constant higher than the first dielectric spacer. The semiconductor layer 22 may comprises a silicon layer having a thickness of 10 nm or less in some embodiments and raised source and drain regions in some embodiments. The epitaxial raised source and drain regions comprise doped silicon germanium in one or more embodiments and carbon doped silicon in other embodiments. Each diagonally extending surface in the RSD region is comprised of a (111) crystal plane in one or more embodiments. The first dielectric spacer may comprise a material having a k value lower than the k value of silicon nitride, such as silicon dioxide. The k value of the first dielectric spacer in each recess is between 2.4 and 4.0 in some embodiments. The diagonally extending surfaces of each epitaxial raised source and drain region 30 comprise converging crystal planes in one or more embodiments, such as illustrated in FIGS. 4-8. An electrically conductive contact layer 32 may be provided on each epitaxial raised source and drain region, as shown in FIGS. 7B and 8B, the second dielectric spacer 70 extending between each contact layer and the gate conductor 72. The substrate comprises a partially depleted silicon on insulator substrate in alternative embodiments, such as shown in FIGS. 8A and 8B. Each first (low-k) dielectric spacer comprises a material having a k value between 2.4 and 4.0 and the second dielectric spacer has a k value between 4.0 and 8.0 in one or more embodiments. The second dielectric spacer is comprised of a single material in some embodiments, such as silicon nitride. In other embodiments, the second dielectric spacer is comprised of multiple layers as discussed in further detail above. In one or more embodiments of the exemplary structure, each of the epitaxial source and drain regions comprises an embedded stressor layer on the substrate and a capping layer on the embedded stressor layer, and further wherein the laterally extending recesses comprise converging crystal planes within the capping layers. The embodiment of FIGS. 8A-B discloses a structure 90 having embedded stressor layers 94B and doped capping layers 94A wherein the recesses containing the low-k spacers 64 are within the capping layers.

A further structure provided in accordance with the present disclosure comprises a substrate including a semiconductor layer on an insulating layer, epitaxial raised source and drain regions (e.g. regions 30) on the semiconductor layer of the substrate, each of the raised source and drain regions including top and bottom surfaces and a laterally extending recess defined by converging crystal planes between the top and bottom surfaces. The structure further includes a trench 60 above the substrate and between the laterally extending recesses within the raised source and drain regions and a dielectric layer 54 on the top surface of each of the raised source and drain regions. An exemplary embodiment of such a structure is shown in FIG. 4. The structure further includes a dielectric material 62 within the trench and the laterally extending recesses in a further embodiment, such as shown in FIG. 5. The dielectric material in the trench and recesses comprises a material having a k value between 2.4 and 4.0 in one or more embodiments. The semiconductor layer (e.g. layer 22) comprises a silicon layer having a thickness of ten nanometers or less in one or more embodiments. Each recess within the RSD regions has a triangular configuration in one or more embodiments. Each raised source and drain region comprises silicon and each converging crystal plane is a (111) crystal plane in one or more embodiments. The exemplary structure further includes a dielectric spacer 64 within each of the laterally extending recesses, such as shown in FIG. 6, in some embodiments of the structure. Each laterally extending recess has a triangular configuration in further embodiments of the structure as the converging crystal planes converge at a point, the dielectric spacers being positioned within the triangular recesses as shown in FIG. 6. Each raised source and drain region comprises silicon and each diagonally extending surface is a (111) crystal plane in any of the above embodiments. The substrate comprises a partially depleted silicon on insulator substrate, each laterally extending recess having a triangular configuration and extending from between the top surface of one of the raised source and drain regions and the substrate, in one or more embodiments, such as the embodiments shown in FIG. 8A,B. One of the converging crystal planes defining each recess intersects an interface between the top surface of one of the RSD regions 30, 94 and one of the dielectric layers 54 in one or more embodiments.

A further exemplary structure includes a substrate including a semiconductor layer on an insulating layer and a field effect transistor including a gate conductor and source/drain regions on the substrate. A laterally extending recess defined by converging crystal planes is within each source/drain region. A first dielectric spacer comprised of a first material having a first dielectric constant is within each of the laterally extending recesses. (See, for example, the low-k spacers 64 in FIGS. 7A-B and FIGS. 8A-B.) A second dielectric spacer is between the gate conductor and each of the first dielectric spacers. The second dielectric spacer (e.g. element 70 in FIGS. 7A-B and 8A-B) is comprised of a second material having a dielectric constant higher than the dielectric constant of the first material. In one or more embodiments of the exemplary structure, the semiconductor layer comprises a silicon layer having a thickness of 10 nm or less and the epitaxial source/drain regions comprise epitaxial raised source/drain regions. The embodiment of FIGS. 7A-B includes RSD regions 30 on an ETSOI layer having such a thickness. In some embodiments of the structure, the substrate comprises a partially depleted silicon on insulator substrate and each of the epitaxial source/drain regions comprises an embedded stressor layer on the substrate and a capping layer on the embedded stressor layer, the laterally extending recesses being located within the capping layers. The discussion above with respect to FIGS. 8A-B relate to a structure 90 having such a substrate having doped embedded stressor and capping regions. Each of the epitaxial source/drain regions of the exemplary structure comprises an embedded stressor layer on the substrate in some embodiments and a capping layer on the embedded stressor layer. In such embodiments, the laterally extending recesses are located within the capping layers. As discussed above, capping layers comprising silicon germanium are readily amenable to etching in chlorine or hydrochloric acid. FIGS. 8A-B disclose such an exemplary structure wherein the substrate includes a PDSOI layer 92.

A first exemplary method is provided that includes obtaining a semiconductor-on-insulator substrate, forming a sacrificial gate layer (e.g. layer 52 in FIG. 2) on the substrate, and forming doped raised source and drain regions on the substrate, each raised source and drain region having a top surface and a bottom surface. The sacrificial gate layer is removed, thereby forming a space between the source and drain regions, such as shown in FIG. 3. The method further includes laterally etching the raised source and drain regions to form laterally expanded recesses extending from the space into the source and drain regions such as shown in FIG. 4 and filling the space with a first dielectric material. FIG. 5 shows the filling of the space 60 with a dielectric material 62, which is a low-k oxide material in some embodiments. Subsequent steps may include forming a recess in the first dielectric material while maintaining the first dielectric material as first dielectric spacers within the laterally expanded recesses, such as shown in FIG. 6, forming a second dielectric spacer within the space, and forming an electrically conductive gate structure within and adjoining the second dielectric spacer. An exemplary second dielectric spacer 70 and gate structure 72 are shown in FIGS. 7A and 7B.

A further exemplary method includes obtaining a structure including a semiconductor-on-insulator substrate, a dielectric layer, source and drain regions between the substrate and the dielectric layer, each source and drain region having a laterally extending recess bounded by surfaces extending diagonally with respect to the substrate and the dielectric layer, a trench above the substrate and between the raised source and drain regions, and a first dielectric material within the trench and laterally extending recesses. FIG. 5 shows such a structure. The first dielectric material is removed from the trench such that the first dielectric material remains in the laterally extending recesses, as exemplified by FIG. 6. A dielectric spacer is formed on the structure within the trench, the dielectric spacer comprising material having a higher k value than the k value of the first dielectric material. A gate conductor is formed within the trench and adjoins the dielectric spacer. FIGS. 7A and 8A show structures having gate conductors 72 formed within trenches and spacers 70 having relatively high k values formed in accordance with the further exemplary method.

A further exemplary method includes obtaining a structure such as schematically illustrated in FIG. 3 that includes a semiconductor-on-insulator substrate, a dielectric layer, source and drain regions between the substrate and the dielectric layer and having top and bottom surfaces, and a trench above the substrate and between the source and drain regions, laterally etching the source and drain regions (e.g. regions 30, 94A) along crystal planes thereof to form laterally expanded recesses such as shown in FIG. 4 that extend from the trench into the source and drain regions, and filling the trench and laterally extending recesses with a first dielectric material as exemplified by FIG. 5. In one or more further embodiments of the exemplary method, further steps include removing the first dielectric material from the trench such that the first dielectric material remains in the laterally extending recesses, forming a dielectric spacer on the structure within the trench, the dielectric spacer comprising material having a higher k value than the k value of the first dielectric material, and forming a gate conductor within the trench and adjoining the dielectric spacer. It will be appreciated that such steps can be performed (i) whether the substrate includes, for example, an ETSOI layer or a PDSOI layer or (ii) whether the source/drain regions are raised, monolithic structures grown epitaxially directly on the substrate as shown in FIG. 2 next to the area where the gate is formed or whether they comprise layered structures as shown in the exemplary embodiment of FIGS. 8A-B wherein an embedded stressor layer 94B is grown epitaxially in recessed areas on the substrate rather than next to the gate area and capping layers 94A grown on the embedded stressor layers adjoin the gate area.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof. Terms such as "above" and "below" are generally employed to indicate relative positions as opposed to relative elevations unless otherwise indicated.

It will be appreciated and should be understood that the exemplary embodiments of the invention described above can be implemented in a number of different fashions. The embodiments were chosen and described in order to best explain the principles of the invention and the practical application, and to enable others of ordinary skill in the art to understand the invention for various embodiments with various modifications as are suited to the particular use contemplated. Given the teachings of the invention provided herein, one of ordinary skill in the related art will be able to contemplate other implementations of the invention.

Although illustrative embodiments of the present invention have been described herein with reference to the accompanying drawings, it is to be understood that the invention is not limited to those precise embodiments, and that various other changes and modifications may be made by one skilled in the art without departing from the scope or spirit of the invention.

What is claimed is:

1. A structure comprising:
   a substrate including a semiconductor layer on an insulating layer;
   epitaxial source and drain regions on the semiconductor layer of the substrate, each of the source and drain regions including a laterally extending recess defined by diagonally extending surfaces;
   a gate conductor between the source and drain regions;
   a first dielectric spacer contained within each laterally extending recess, and
   a second dielectric spacer positioned between the gate conductor and the first dielectric spacers, the second dielectric spacer being comprised of a material having a dielectric constant higher than the first dielectric spacer.

2. The structure of claim 1, wherein the semiconductor layer comprises a silicon layer having a thickness of 10 nm or less and the epitaxial source and drain regions comprise epitaxial raised source/drain regions.

3. The structure of claim 2, wherein the epitaxial raised source/drain regions comprise doped silicon germanium.

4. The structure of claim 2, wherein the epitaxial raised source/drain regions comprise carbon doped silicon comprising up to 4% carbon.

5. The structure of claim 2, wherein each diagonally extending surface is comprised of a (111) crystal plane.

6. The structure of claim 5, wherein each first dielectric spacer comprises a material having a k value between 2.4 and 4.0.

7. The structure of claim 6, wherein each first dielectric spacer comprises silicon dioxide.

8. The structure of claim 1, wherein the diagonally extending surfaces comprise converging crystal planes.

9. The structure of claim 8, further comprising an electrically conductive contact layer on each of the epitaxial source and drain regions, the second dielectric spacer extending between each contact layer and the gate conductor.

10. The structure of claim 1, wherein the substrate comprises a partially depleted silicon on insulator substrate and each of the epitaxial source and drain regions comprises an embedded stressor layer on the substrate and a capping layer on the embedded stressor layer, and further wherein the laterally extending recesses comprise converging crystal planes within the capping layers.

11. The structure of claim 1, wherein each first dielectric spacer comprises a material having a k value between 2.4 and 4.0.

12. The structure of claim 11, wherein the second dielectric spacer is comprised of a single material having a k value between 4.0 and 8.0.

13. A structure comprising:
a substrate including a semiconductor layer on an insulating layer;
epitaxial raised source and drain regions on the semiconductor layer of the substrate, each of the raised source and drain regions including top and bottom surfaces and a laterally extending recess defined by converging crystal planes between the top and bottom surfaces;
a trench above the substrate and between the laterally extending recesses within the raised source and drain regions, and
a dielectric layer on the top surface of each of the raised source and drain regions.

14. The structure of claim 13, further including a dielectric material within the trench and the laterally extending recesses.

15. The structure of claim 14, wherein the dielectric material in the trench and recesses has a k value between 2.4 and 4.0.

16. The structure of claim 13, wherein the semiconductor layer comprises a silicon layer having a thickness of ten nanometers or less.

17. The structure of claim 13, wherein the converging crystal planes converge at a point.

18. The structure of claim 17, wherein each raised source and drain region comprises silicon and each converging crystal plane comprises a (111) crystal plane.

19. The structure of claim 13, further including a dielectric spacer within each of the laterally extending recesses.

20. The structure of claim 19, wherein the converging crystal planes converge at a point.

21. The structure of claim 13, wherein each of the raised source and drain regions comprises silicon and each converging crystal plane comprises a (111) crystal plane.

22. A structure comprising:
a substrate including a semiconductor layer on an insulating layer;
a field effect transistor including a gate conductor and source/drain regions on the substrate;
a laterally extending recess defined by converging crystal planes within each source/drain region;
a first dielectric spacer comprised of a first material having a first dielectric constant within each of the laterally extending recesses, and
a second dielectric spacer between the gate conductor and each of the first dielectric spacers, the second dielectric spacer being comprised of a second material having a dielectric constant higher than the dielectric constant of the first material.

23. The structure of claim 22, wherein the semiconductor layer comprises a silicon layer having a thickness of 10 nm or less and the epitaxial source/drain regions comprise epitaxial raised source/drain regions.

24. The structure of claim 22, wherein the substrate comprises a partially depleted silicon on insulator substrate and each of the epitaxial source/drain regions comprises an embedded stressor layer on the substrate and a capping layer on the embedded stressor layer, the laterally extending recesses being located within the capping layers.

25. The structure of claim 22, wherein each of the epitaxial source/drain regions comprises an embedded stressor layer on the substrate and a capping layer on the embedded stressor layer, the laterally extending recesses being located within the capping layers.

* * * * *